(12) United States Patent
Perozziello et al.

(10) Patent No.: US 11,194,179 B2
(45) Date of Patent: Dec. 7, 2021

(54) WIRING ON CURVED SURFACES

(71) Applicant: Spy Eye, LLC, Los Gatos, CA (US)

(72) Inventors: Eric Anthony Perozziello, Discovery Bay, CA (US); Edward John Palen, Corte Madera, CA (US); Michael West Wiemer, San Jose, CA (US)

(73) Assignee: Tectus Corporation, Saratoga, CA (US)

( * ) Notice: Subject to any disclaimer, the term of this patent is extended or adjusted under 35 U.S.C. 154(b) by 427 days.

(21) Appl. No.: 15/629,610

(22) Filed: Jun. 21, 2017

(65) Prior Publication Data

US 2018/0017813 A1  Jan. 18, 2018

Related U.S. Application Data

(60) Provisional application No. 62/413,383, filed on Oct. 26, 2016, provisional application No. 62/363,088, filed on Jul. 15, 2016.

(51) Int. Cl.
*G02C 11/00* (2006.01)
*H05K 3/10* (2006.01)
(Continued)

(52) U.S. Cl.
CPC .......... *G02C 11/10* (2013.01); *G02B 27/0172* (2013.01); *G02C 7/04* (2013.01); *H01F 17/0006* (2013.01); *H01F 27/2804* (2013.01); *H01F 41/042* (2013.01); *H01Q 1/22* (2013.01); *H01Q 1/273* (2013.01); *H01Q 1/38* (2013.01); *H01Q 7/00* (2013.01); *H01Q 9/04* (2013.01); *H05K 1/09* (2013.01); *H05K 1/11* (2013.01); *H05K 1/165* (2013.01); *H05K 1/181* (2013.01); *H05K 3/0026* (2013.01); *H05K 3/0044* (2013.01); *H05K 3/107* (2013.01); *H05K 3/18* (2013.01); *H05K 3/182* (2013.01); *H02J 50/10* (2016.02); *H05K 3/146* (2013.01); *H05K 3/16* (2013.01); *H05K 2201/0108* (2013.01);
(Continued)

(58) Field of Classification Search
CPC .......... G02C 7/083; G02C 7/101; G02C 7/04; G02C 11/10; G02B 27/0172; H01F 17/0006; H01F 27/2804; H01F 41/042
USPC ............ 351/159.01–159.03, 159.05, 159.06, 351/159.39, 159.74, 159.81, 178
See application file for complete search history.

(56) References Cited

U.S. PATENT DOCUMENTS

| | | | |
|---|---|---|---|
| 5,108,169 A * | 4/1992 | Mandell | G02C 7/021 349/200 |
| 5,880,809 A | 3/1999 | Lieberman | |

(Continued)

OTHER PUBLICATIONS

Fraunhofer IOF: Laserlithography on Plane and Curved Surfaces, undated, 1 page.
(Continued)

*Primary Examiner* — Travis S Fissel
(74) *Attorney, Agent, or Firm* — Fenwick & West LLP

(57) ABSTRACT

A process for creating wiring on a curved surface, such as the surface of a contact lens, includes the following. Creating a groove or trench in the curved surface. Forming a seed layer on the surface and on the groove. Removing the seed layer from the surface while leaving some or all of it in the groove. Depositing conductive material in the groove. Preferably, the deposited conductive material is thicker than the seed layer.

21 Claims, 11 Drawing Sheets

(51) Int. Cl.

| | | |
|---|---|---|
| *H05K 1/09* | (2006.01) | |
| *H05K 3/00* | (2006.01) | |
| *H05K 1/16* | (2006.01) | |
| *H05K 3/18* | (2006.01) | |
| *H05K 1/18* | (2006.01) | |
| *H05K 1/11* | (2006.01) | |
| *H01F 27/28* | (2006.01) | |
| *G02C 7/04* | (2006.01) | |
| *G02B 27/01* | (2006.01) | |
| *H01Q 1/22* | (2006.01) | |
| *H01Q 1/38* | (2006.01) | |
| *H01F 17/00* | (2006.01) | |
| *H01F 41/04* | (2006.01) | |
| *H05K 3/16* | (2006.01) | |
| *H05K 3/14* | (2006.01) | |
| *H01Q 7/00* | (2006.01) | |
| *H01Q 9/04* | (2006.01) | |
| *H01Q 1/27* | (2006.01) | |
| *H02J 50/10* | (2016.01) | |

(52) U.S. Cl.
CPC .......... *H05K 2201/09018* (2013.01); *H05K 2201/10098* (2013.01); *H05K 2201/10128* (2013.01); *H05K 2203/107* (2013.01); *Y02P 70/50* (2015.11)

(56) References Cited

U.S. PATENT DOCUMENTS

| | | |
|---|---|---|
| 6,578,254 B2 | 6/2003 | Adams et al. |
| 8,485,662 B2 | 7/2013 | Collins |
| 8,579,434 B2 | 11/2013 | Amirparviz |
| 8,608,310 B2 | 12/2013 | Otis |
| 8,721,074 B2 | 5/2014 | Pugh |
| 8,786,675 B2 | 7/2014 | Deering |
| 8,960,898 B1 | 2/2015 | Etzkorn |
| 8,985,763 B1 | 3/2015 | Etzkorn et al. |
| 9,054,079 B2 | 6/2015 | Etzkorn |
| 9,161,712 B2 | 10/2015 | Etzkorn |
| 9,192,298 B2 | 11/2015 | Bouwstra et al. |
| 9,271,677 B2 | 3/2016 | Leonardi |
| 9,282,920 B2 | 3/2016 | Ho et al. |
| 9,323,073 B2 | 4/2016 | Pugh |
| 9,389,434 B2 | 7/2016 | Jubin et al. |
| 9,884,180 B1 * | 2/2018 | Ho .................. B29D 11/00826 |
| 2002/0057416 A1 * | 5/2002 | Streibig ........... B29D 11/00903 351/159.24 |
| 2002/0159025 A1 | 10/2002 | Legerton |
| 2004/0135644 A1 * | 7/2004 | Mizoguchi ......... G02B 26/0841 331/154 |
| 2014/0098226 A1 | 4/2014 | Pletcher |
| 2014/0197558 A1 | 7/2014 | Linhardt |
| 2014/0200424 A1 * | 7/2014 | Etzkorn .............. A61B 5/14532 600/345 |
| 2014/0211473 A1 * | 7/2014 | Weidman .............. G02B 5/0808 362/259 |
| 2015/0236223 A1 * | 8/2015 | Moosburger ......... H01L 33/504 257/98 |
| 2015/0362752 A1 | 12/2015 | Linhardt et al. |
| 2016/0091737 A1 | 3/2016 | Kim et al. |
| 2017/0168322 A1 | 6/2017 | Toner |
| 2017/0371184 A1 | 12/2017 | Shtukater |

OTHER PUBLICATIONS

Paul, K.E. et al., "Patterning Spherical Surfaces at the Two-Hundred-Nanometer Scale Using Soft Lithography," Advanced Functional Materials, Apr. 2003, pp. 259-263, vol. 13, No. 4.

* cited by examiner

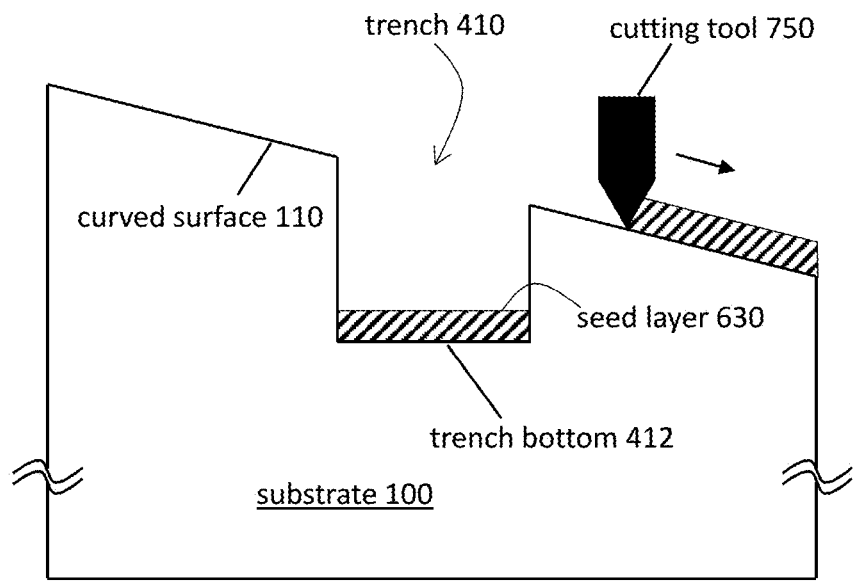
Fig. 7
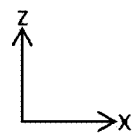

WIRING ON CURVED SURFACES

CROSS-REFERENCE TO RELATED APPLICATIONS

This application claims priority under 35 U.S.C. § 119(e) to U.S. Provisional Patent Application Ser. No. 62/363,088, "Method for manufacture of contact lenses and for Forming Fine Features on an Arbitrary 3D Surface," filed Jul. 15, 2016 and Ser. No. 62/413,383, "Wiring on curved surfaces," filed Oct. 26, 2016. The subject matter of all of the foregoing is incorporated herein by reference in their entirety.

BACKGROUND

An eye-mounted display has been proposed by Deering. See, e.g. U.S. Pat. No. 8,786,675, "Systems using eye mounted displays". One type of eye-mounted display is based on a tiny projector mounted inside a contact lens. The projector projects images onto the retina of a person wearing the lens.

Projectors and other electronic components mounted in the contact lens typically use electrical connections to each other. Although there are myriad ways to make electrical interconnects on flat surfaces, the curved surface of a contact lens presents a challenge. On a flat surface, conductive layers can be patterned by photolithography and etching. However, conventional photolithography is not easily compatible with curved surfaces.

Therefore, what is needed are methods for making electrical connections on curved surfaces.

FIGURES

FIG. 7 shows the trench of FIG. 6 during removal of the seed layer.

DESCRIPTION

Wiring on a curved surface may be accomplished via a process involving: creating a groove or trench in the surface; coating the surface and the groove with a seed layer; removing the seed layer from the surface while allowing it to remain in the groove; and plating conductive material in the groove to form a conductive trace or wire. ("Groove" and "trench" are interchangeable terms.)

The process is suitable for forming wires or other small features on a contact lens component having an overall surface radius of curvature less than 1 cm, for example. After wires are formed, the surface may be made optically smooth; i.e. having surface roughness less than one-tenth the wavelength of visible light.

In one approach to the wiring process, the depth of the groove is made greater than the depth precision of the technique used to remove the seed layer. The groove itself may be made by mechanical milling or lathing, laser machining, or molding, as examples.

Figure 1:
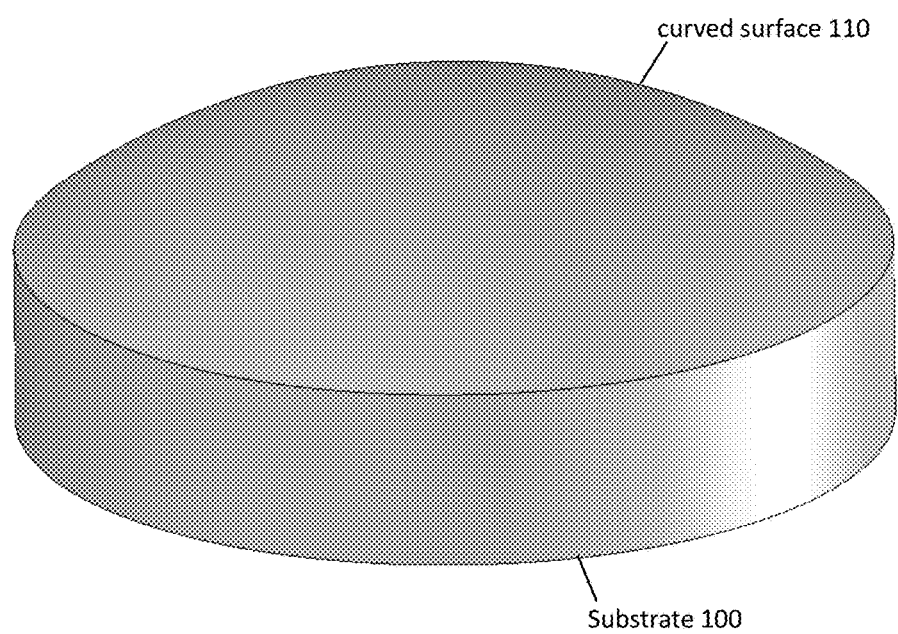
FIG. 1 shows a substrate with a curved surface.

FIG. 1 shows a substrate 100 with a curved surface 110. Although the techniques described below are applicable to any curved surface, for purposes of illustration, the substrate 100 shown in FIG. 1 is made from a solid, transparent material and, once shaped and outfitted with various optical and electronic components, may become part of an eye-mounted display.

Suitable materials for this purpose may include poly (methyl methacrylate) (PMMA), polycarbonate (PC) or rigid gas permeable contact lens material (RGP). The curved surface 110 of a substrate intended for eye-mounted display applications may have a radius of curvature of about 6 to 9 mm. The substrate 100 may also be toric; i.e. it may have different radii of curvature in different directions. The diameter of the substrate may be about 8 mm, although large substrates may have diameters as large as 16 mm, for example. The substrate 100 may be a contact lens blank that is finished into a contact lens after forming wires as described below.

Figure 2:
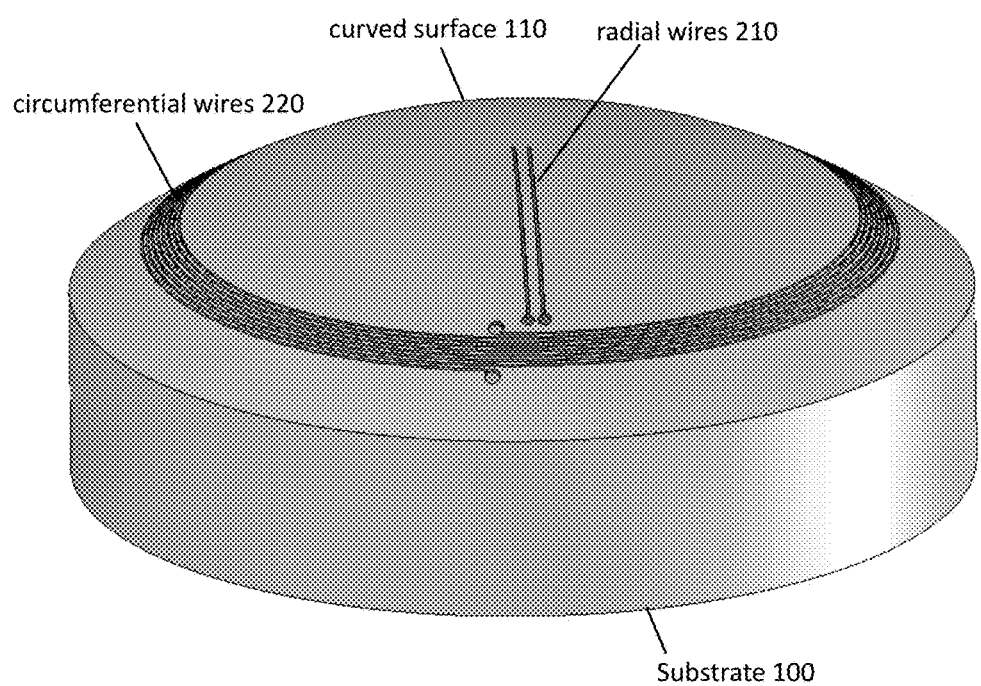
FIG. 2 shows the substrate of FIG. 1 after electrical interconnects have been formed on it.

FIG. 2 shows the substrate of FIG. 1 after electrical interconnects have been formed on it. The substrate 100 of FIGS. 1 and 2 is cylindrical, and this leads to nomenclature for wires formed on a curved surface 110 at one end of the cylinder. Wires oriented between the center of the cylinder and its edge are "radial wires" 210. "Circumferential wires" 220 are perpendicular to the radial wires. Of course, wires may be formed at any angle between radial and circumferential, and they may be placed anywhere on the curved surface. In the example of FIG. 2, the circumferential wires 220 form an eight-turn spiral.

Figure 3:
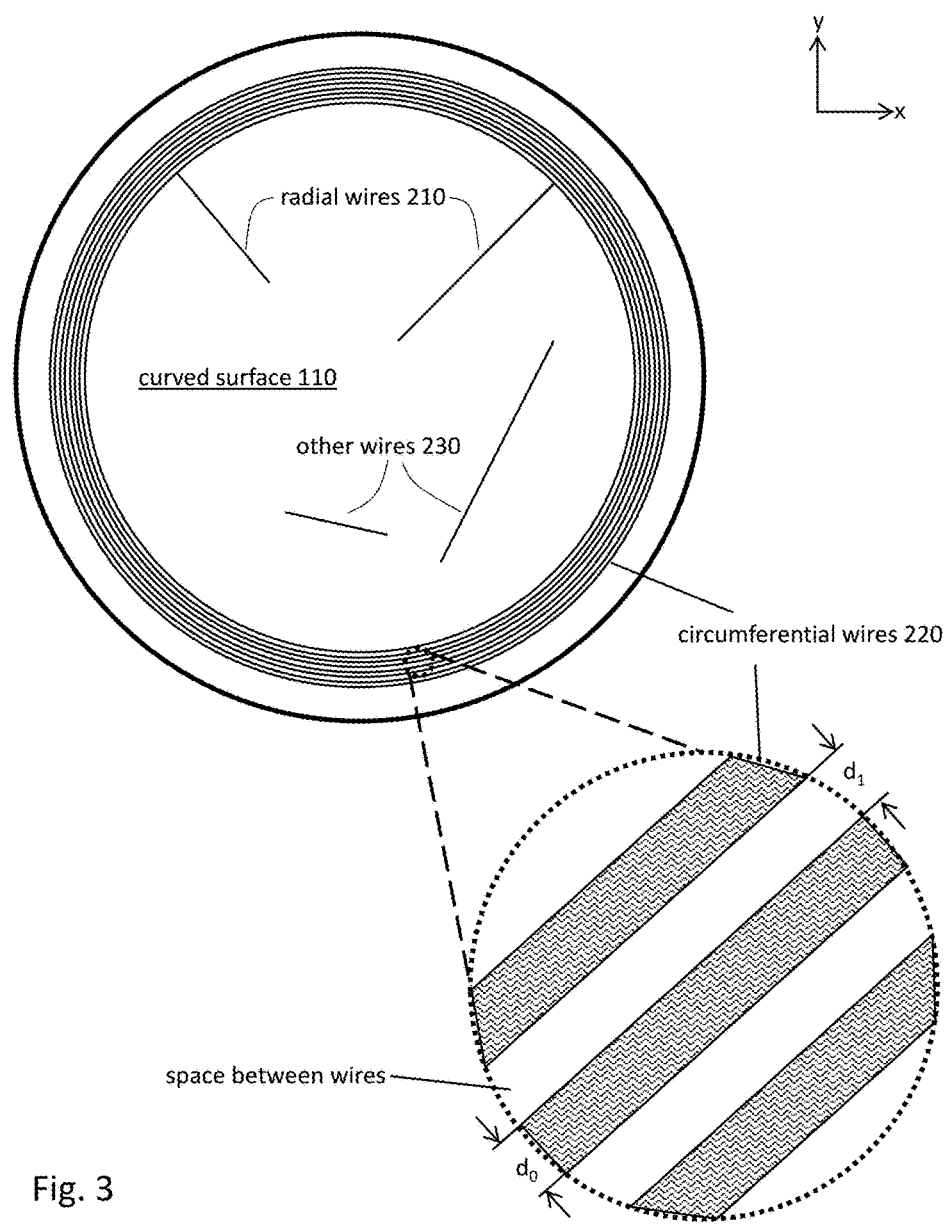
FIG. 3 shows a more detailed, top view of a substrate like that of FIG. 2.

FIG. 3 shows a more detailed, top view of a substrate like that of FIG. 2. For ease of illustration, the circumferential wires 220 in FIG. 3 are drawn as a set of concentric circles, rather than a spiral. The width of the circumferential wires 220 is do and the spacing between adjacent wires is $d_1$. In an example device, $d_0$ and $d_1$ were both about 25 microns. "Other wires" 230 are also shown on the curved surface in FIG. 3. These are wires that have neither radial nor circumferential orientation.

An eye-mounted display is an example device that might use this technology. One type of eye-mounted display is based on a tiny projector and electronics mounted inside a contact lens, such as a scleral contact lens. The projector projects images onto the retina of a person wearing the lens. For example, see U.S. Pat. No. 8,786,675, which is incorporated by reference in its entirety. The conductive traces could form a coil for wireless power transfer to the components in the contact lens. Coils preferably have between 1 and 30 total turns, and more preferably approximately 8 turns. A typical coil spacing is about 50 microns between adjacent turns. They could also form an antenna, such as a dipole antenna, for wireless communication from or to the components in the contact lens. A 5 GHz dipole extends about 14 mm circumferentially. They could also provide electrical interconnects to, from or between the various components.

In one approach, the first step in a process to create wires such as those shown in FIGS. 2 and 3 is to create grooves or trenches in a curved surface. The grooves may be made by mechanical milling or lathing, or by laser machining, or molding, as examples. Modern micro milling or micro lathing machines can produce features as small as a few microns and laser machining can produce sub-micron features. Laser machining is usually faster than mechanical methods. Focused ion beam milling is an alternative that is appropriate for making few-micron, sub-micron or even nanometer scale features.

Figure 4A:
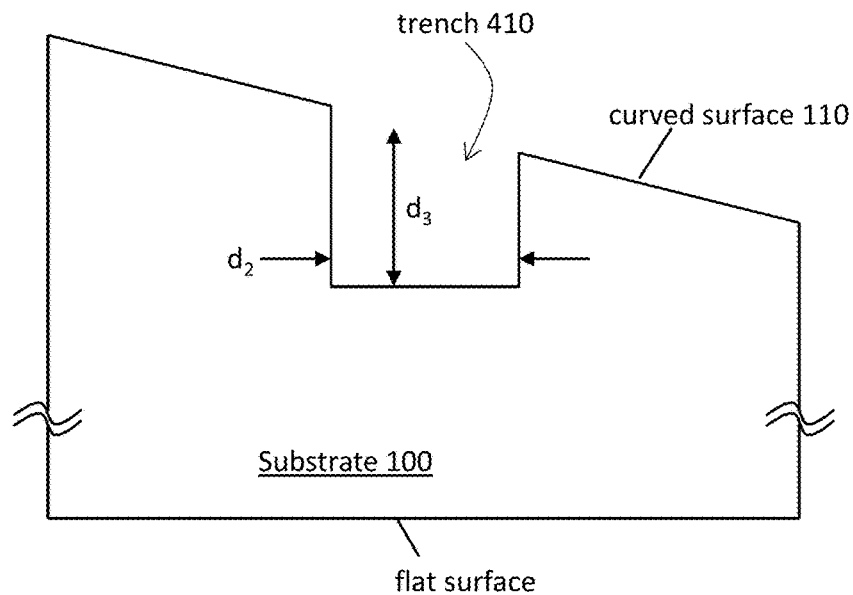
FIGS. 4A and 4B are cross sectional views of trenches in a curved surface of a substrate.
Figure 4B:
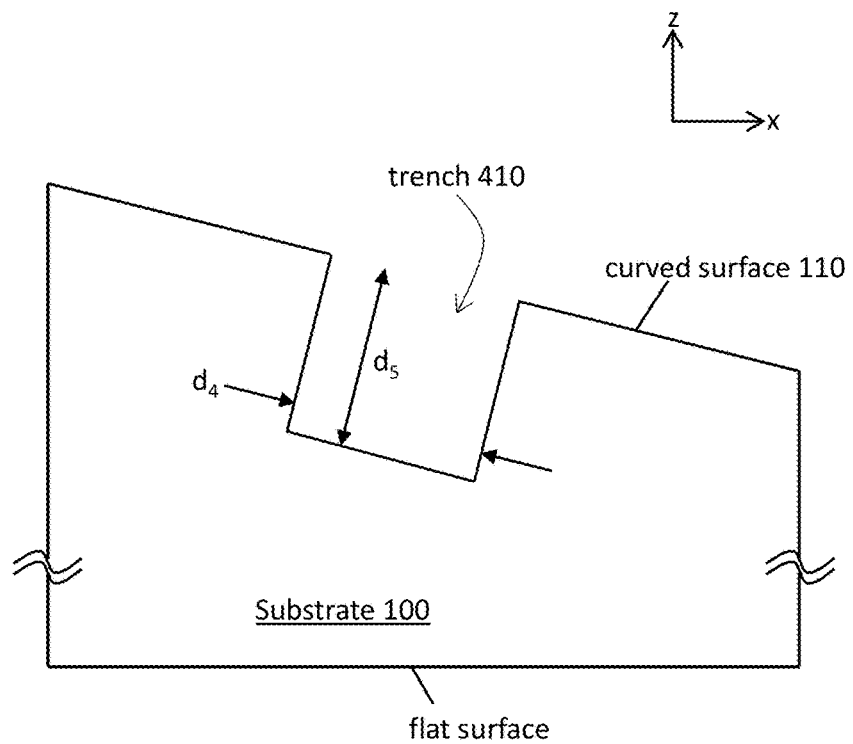

FIGS. 4A and 4B are cross sectional views of trenches 410 in a curved surface 110 of a substrate 100. The curved surface 110 appears flat in the figures because only a small section (i.e. much smaller than the radius of curvature) of the surface is shown. The trench 410 in FIG. 4A is cut into the curved surface in a direction perpendicular to a flat surface of the substrate (e.g., parallel to the direction of the optical axis of a contact lens). The trench 410 in FIG. 4B is cut into the curved surface in a direction perpendicular to the curved surface 110.

Trenches like that shown in FIG. 4A are usually easier to make than trenches like that shown in FIG. 4B because in the former case machine tooling need only move in x, y and z directions. To make the trench shown in FIG. 4B, a machine must also be able to tilt with respect to the z axis. In FIGS. 4A and 4B, the substrate 100 is shown with a flat surface, but this is not required. The substrate 100 could have all curved surfaces.

The aspect ratio of a trench or groove is the ratio of its depth to its width. The aspect ratios of grooves shown in FIGS. 4A and 4B are $d_3:d_2$ and $d_5:d_4$, respectively. The processes for making wiring on a curved surface described herein are robust for 1:1 trenches and work well for aspect ratios greater than 1:1 and less than about 10:1. Preferably, the spacing between adjacent grooves should not be much less than the width of a groove nor much less than the depth of a groove. In FIG. 3, for example $d_1 \ll d_0$ is usually not desirable because of possible mechanical instability of the resulting wall.

Figure 5:
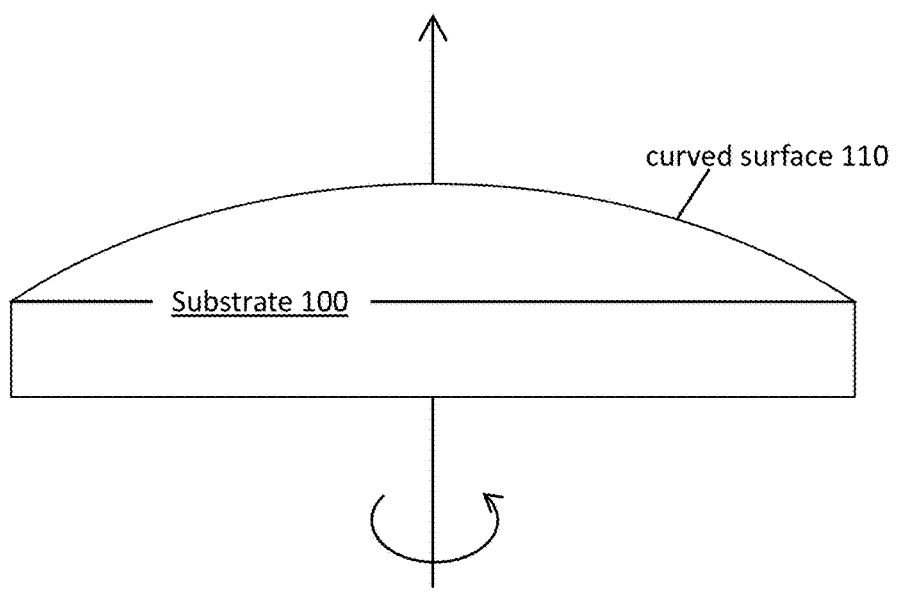
FIG. 5 shows a substrate with a curved surface.

FIG. 5 shows a substrate 100 with a curved surface 110. The substrate of FIG. 5, like those of FIGS. 1, 2 and 3, is symmetric about the z axis. Rotation about the z axis may be useful when making trenches for circumferential wires and during seed layer removal steps described below. The radius of curvature of the curved surface in FIG. 5, and in all other figures, may be less than 1 cm. If the surface is toric, its radii of curvature may each be less than 1 cm.

Figure 6:
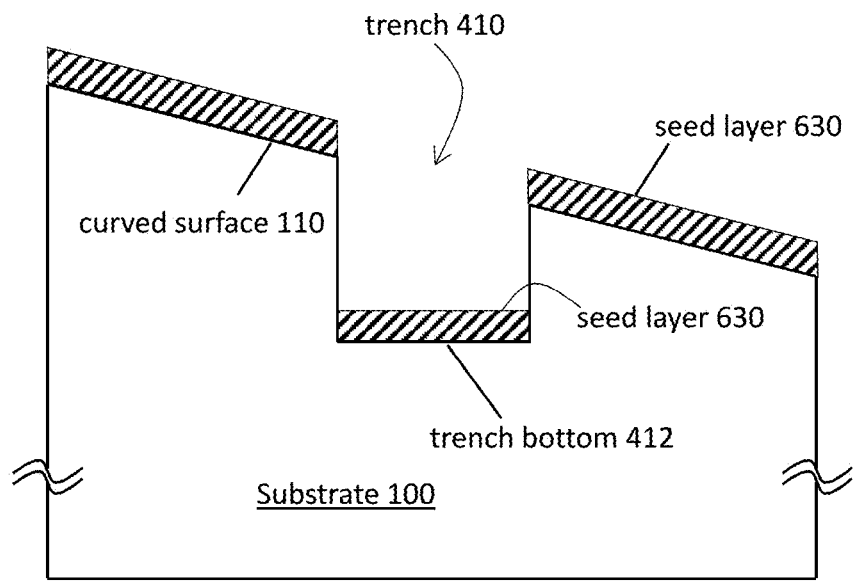
FIG. 6 shows a trench in a substrate after blanket deposition of a seed layer.
Figure 6:
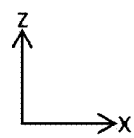

After grooves are formed in a curved surface, the next step in creating wiring on the surface is blanket deposition of a seed layer. FIG. 6 shows a trench 410 in a substrate 100 after this deposition step. The seed layer 630 has been deposited on the curved surface 110 and on the bottom 412 of the trench 410. Seed layer deposition may be accomplished in a vacuum chamber via evaporation or sputtering, for example. Suitable seed layer materials are those that will catalyze a later plating step in the process. The seed layer need not be conductive.

The bottom of a groove like that shown in FIG. 4A is easily coated with seed material from a source in the z direction. A groove like that shown in FIG. 4B may partially shadow its bottom surface from z-direction coating if the aspect ratio of the groove is too great. Overall, the goal of this step is to coat at least part of the bottom 412 of the groove 410 with seed material 630.

The next step is to remove seed material from the curved surface while leaving at least some of it in the groove. FIG. 7 shows the trench 410 of FIG. 6 during removal of the seed layer. In the example of FIG. 7, the substrate 100 is rotated around the z axis (as in FIG. 5) and a cutting tool 750 removes the seed layer 630 from the curved surface 110. The cutting tool 750 moves slowly in a radial direction as seed material 630 is scraped off the rotating substrate 100. The cutting tool may be a diamond tip or a sharpened metal tip. This is an example of a turning process (e.g., diamond turning) for removing the seed layer.

Seed material may be removed in more than one step. For example, a coarse removal step may take off most of the material while a fine removal step, such as diamond turning, may remove the rest of the material while leaving an optically smooth finish. Chemical and/or mechanical polishing is an alternate method to remove seed material. A polishing machine having a polishing pad and an abrasive slurry of alumina or carborundum may be used to remove the seed material, for example. Harder seed materials (e.g. nickel) may be easier to remove precisely by polishing than softer materials (e.g. gold).

The process that removes seed material preferably has a depth precision better than the depth of the groove. In other words, material preferably is removed in increments less than $d_3$ or $d_5$ in FIGS. 4A and 4B, respectively. If a trench is 25 microns deep, for example, the method used to remove seed material from the curved surface preferably has a precision that is better than 25 microns. For example, this may be achieved by removing less than 25 microns of material at a time.

Figure 8:
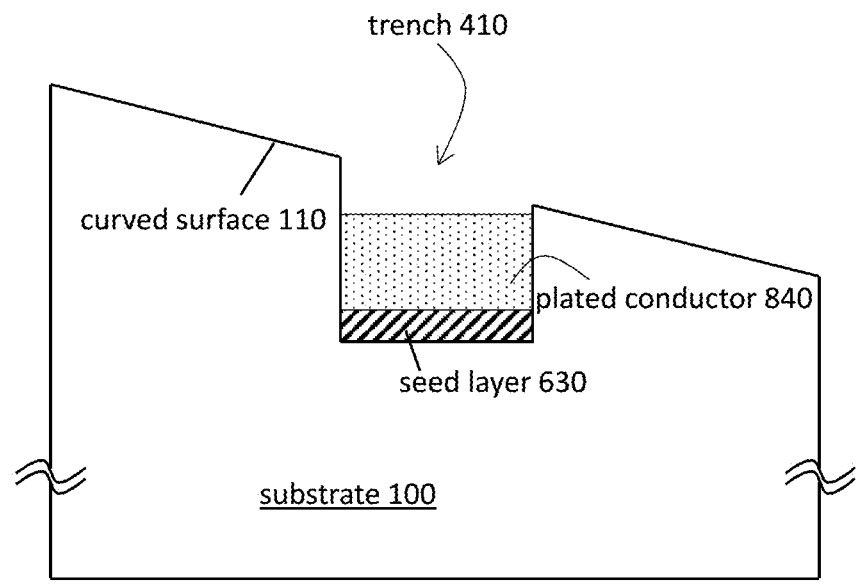
FIG. 8 shows the trench of FIG. 7 after plating conductive material in the trench.
Figure 9:
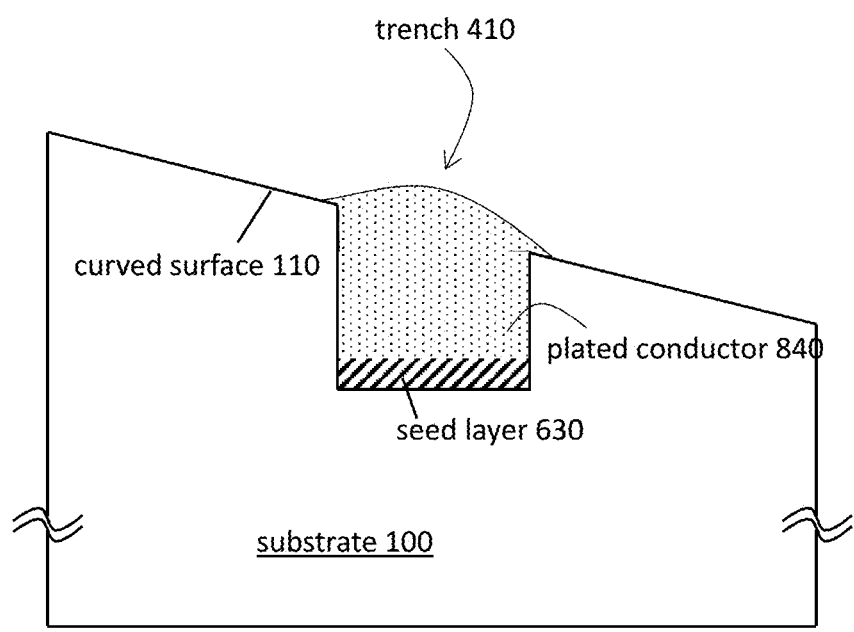
FIG. 9 shows the trench of FIG. 8 after additional plating.

The next step in a process to create wires on a curved surface is to plate a conductor onto the seed layer in the trenches. Plating may be electrolytic or autocatalytic (electroless), for example. FIG. 8 shows the trench 410 of FIG. 7 after plating conductive material 840 in the trench and FIG. 9 shows the trench of FIG. 8 after additional plating extends the conductive trace beyond the curved surface. An example seed layer is about 100 angstroms of chrome followed by about 600 angstroms of copper. About 20 microns of copper may be plated on this seed layer via an autocatalytic plating process.

If the substrate is made of plastic, a seed layer may be made by treating the plastic with stannous chloride ($SnCl_2$). In this case, the seed layer is not deposited or coated onto the substrate. Rather, it is formed by chemical treatment of the substrate material. Diamond turning may remove this treatment from a curved surface while leaving it in a trench. Metals, such as copper, silver and/or gold may then be plated in grooves in the plastic that have undergone stannous chloride treatment. This catalyst or sensitization process provides a seed layer.

Figure 10:
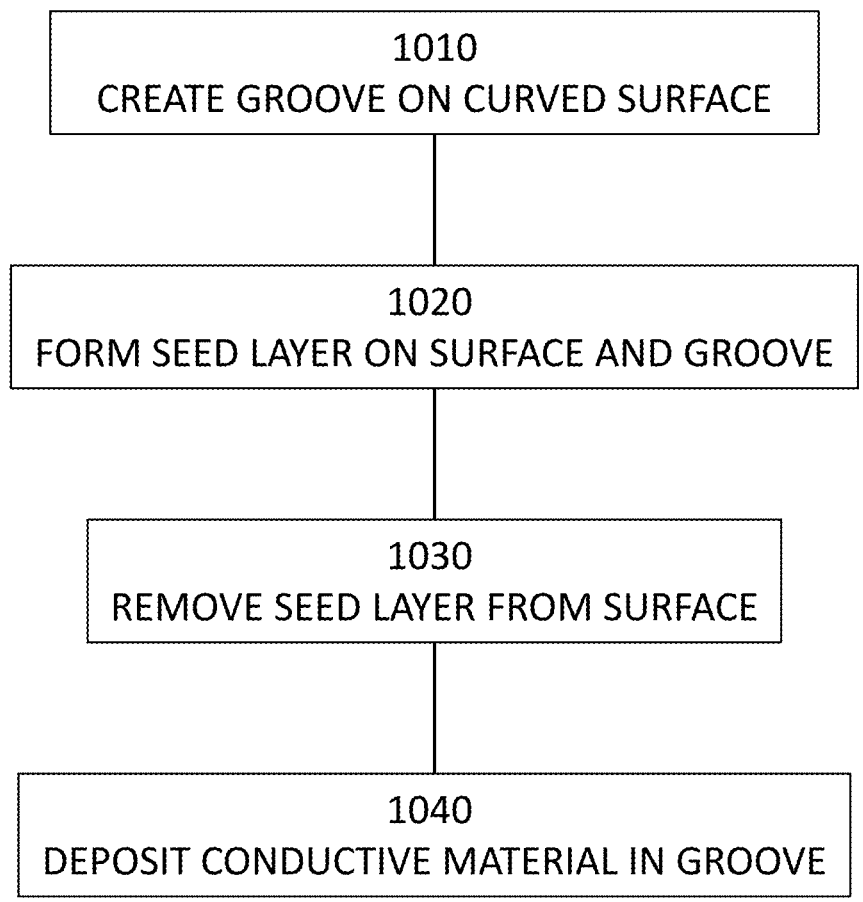
FIG. 10 is a flow chart for a process for wiring on a curved surface.

The steps described above are summarized in FIG. 10 which is a flow chart for a process for wiring on a curved surface. The steps in FIG. 10 are the following. Create 1010 groove on a curved surface. Form 1020 seed layer on surface and groove. Remove 1030 seed layer from surface, leaving some or all of the seed layer on the bottom of the groove. Deposit 1040 conductive material onto seed layer in groove.

As an alternative, the last step (deposit conductive material in groove) may be omitted if the seed layer itself is conductive and thick enough to suit electrical requirements for the wire. In that case there is no need to add more conductive material via plating or otherwise. However, in cases where a relatively thick conductor is desired (i.e., larger aspect ratio), it is preferable to used a thinner seed layer followed by a thicker conductive material.

Figure 11:
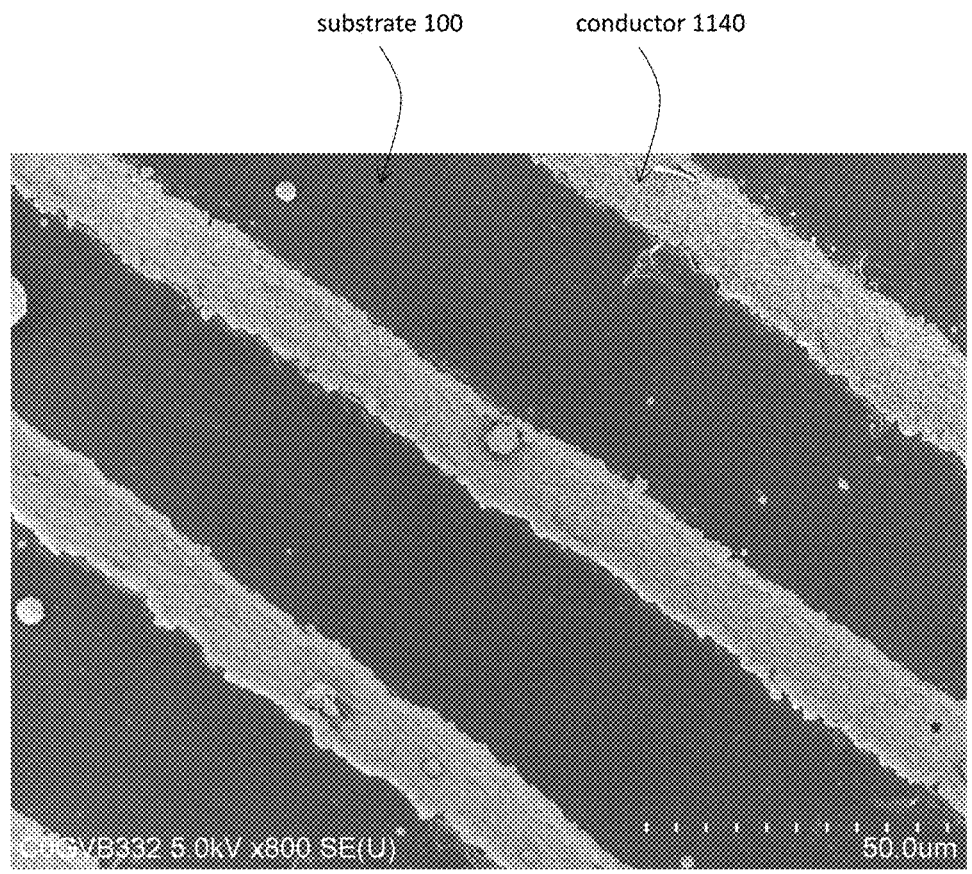
FIG. 11 is an SEM photograph of a spiral inductor formed on a curved surface.

FIG. 11 is an SEM photograph of a spiral inductor formed on a curved surface using the process described above. The curved substrate 100 is a rigid gas permeable plastic (Paragon HDS-100) with an 8 mm radius of curvature, suitable for use as a contact lens. The seed layer is 0.01 microns (100

Angstroms) Cr followed by 0.1 microns (1000 Angstroms) Cu deposited by sputtering. The conductive material 1140 is 15 microns of plated Cu. The Cu plate 1140 is approximately 10-15 microns wide on a 50 micron pitch. In this image, the total scale bar length is 50 microns and the distance between dots is 5 microns center to center. This image was obtained immediately after plating, before any cleaning step. Note that the top surface of the plated metal is not flush with the plastic substrate surface.

Although the detailed description contains many specifics, these should not be construed as limiting the scope of the invention but merely as illustrating different examples. It should be appreciated that the scope of the disclosure includes other embodiments not discussed in detail above. For example, different combinations of seed layers and conductive materials can be used: copper seed layer with nickel plating, or copper seed layer with iron or other magnetic alloy or ferrous plated layer. Nickel and iron are materials that are more difficult to remove than a seed layer such as copper. The seed layer and conductor could also be made of the same material.

Each layer could also include multiple materials. One example is a chromium and copper seed layer with a copper plated layer. The chromium part of the seed layer forms a good bond with a plastic substrate on one side and with the copper part of the seed layer on the other side. The copper of the seed layer is a good seed for plating additional copper. Another example is a copper seed layer with copper, nickel and gold plated layers. The copper is a good conductor, the nickel is a thin diffusion barrier and gold prevents oxidation before subsequent attachment or interconnection.

Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method for creating conductive traces on a curved surface of a contact lens, the method comprising:
    creating a groove in a curved surface of a contact lens material, the groove exposing some contact lens material;
    forming a seed layer on the curved surface and on the contact lens material exposed by the groove;
    removing the seed layer from the curved surface, and leaving some seed layer on the contact lens material exposed by the groove; and
    depositing a conductive material onto the seed layer in the groove.

2. The method of claim 1 where the deposited conductive material has a thickness that is greater than a thickness of the seed layer.

3. The method of claim 1 where the seed layer comprises two or more different materials.

4. The method of claim 1 where the seed layer and the deposited conductive material are made from a same material.

5. The method of claim 1 further comprising: after depositing the conductive material onto the seed layer, finishing the contact lens material into a contact lens.

6. The method of claim 1 where the conductive material is deposited by plating a conductive material onto the seed layer in the groove.

7. The method of claim 6 where the seed layer comprises at least one of chrome and copper, and the conductive material comprises at least one of copper, nickel and gold.

8. The method of claim 1 where the groove is created by one of milling and lathing.

9. The method of claim 1 where the groove is created by laser machining.

10. The method of claim 1 where the seed layer is formed by one of vacuum evaporation and vacuum sputtering.

11. The method of claim 1 where the seed layer is removed by one of diamond turning or polishing.

12. The method of claim 1 where removing the seed layer from the curved surface leaves the curved surface optically smooth.

13. A device comprising:
    a contact lens having a curved surface, with a groove created in the curved surface;
    a seed layer formed on contact lens material exposed by a bottom of the groove and a conductive material deposited onto the seed layer in the groove, the deposited conductive material having a thickness that is greater than a thickness of the seed layer.

14. The device of claim 13 further comprising electronics mounted on or in the contact lens, where the deposited conductive material connects to the electronics.

15. The device of claim 14 where the deposited conductive material forms a coil that wirelessly receives power for the electronics.

16. The device of claim 15 where the coil contains between 1 and 30 turns.

17. The device of claim 14 where the deposited conductive material forms an antenna for wireless communication with electronics.

18. The device of claim 14 where the deposited conductive material forms electrical interconnects for the electronics.

19. The device of claim 14 where the electronics include display electronics for projecting images onto a user's retina.

20. The device of claim 13 where the deposited conductive material extends beyond the curved surface of the contact lens.

21. The device of claim 13 where the contact lens is a scleral contact lens.

* * * * *